United States Patent
Rentala et al.

(10) Patent No.: US 7,586,357 B2
(45) Date of Patent: Sep. 8, 2009

(54) SYSTEMS FOR PROVIDING A CONSTANT RESISTANCE

(75) Inventors: Vijaya B. Rentala, Plano, TX (US); Baher Haroun, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 252 days.

(21) Appl. No.: 11/653,037

(22) Filed: Jan. 12, 2007

(65) Prior Publication Data

US 2008/0169794 A1  Jul. 17, 2008

(51) Int. Cl.
   *H03K 5/08*  (2006.01)
(52) U.S. Cl. .................................... 327/309; 323/312
(58) Field of Classification Search .............. 327/308, 327/309; 323/273, 312, 315
   See application file for complete search history.

(56) References Cited

U.S. PATENT DOCUMENTS

| | | | | |
|---|---|---|---|---|
| 4,465,967 A | | 8/1984 | Tokunaga et al. | |
| 4,477,737 A | * | 10/1984 | Ulmer et al. | 327/541 |
| 4,808,909 A | * | 2/1989 | Eddlemon | 323/313 |
| 4,868,482 A | | 9/1989 | O'Shaughnessy et al. | |
| 6,002,295 A | * | 12/1999 | Gens et al. | 327/546 |
| 6,028,466 A | * | 2/2000 | Hartley | 327/328 |
| 6,166,530 A | * | 12/2000 | D'Angelo | 323/316 |
| 6,333,623 B1 | * | 12/2001 | Heisley et al. | 323/280 |
| 6,784,725 B1 | * | 8/2004 | Wadhwa et al. | 327/543 |
| 6,946,849 B1 | * | 9/2005 | Lu | 324/601 |
| 7,075,281 B1 | | 7/2006 | Pettersen | |
| 7,196,567 B2 | * | 3/2007 | Nguyen | 327/308 |
| 2006/0012451 A1 | | 1/2006 | De Cremoux | |
| 2006/0014956 A1 | | 1/2006 | Deng et al. | |
| 2006/0055454 A1 | * | 3/2006 | Eberlein | 327/538 |
| 2006/0091940 A1 | * | 5/2006 | Kimura | 327/543 |
| 2006/0232326 A1 | * | 10/2006 | Seitz et al. | 327/539 |
| 2008/0048751 A1 | * | 2/2008 | Koen | 327/308 |

* cited by examiner

*Primary Examiner*—Lincoln Donovan
*Assistant Examiner*—Thomas J Hiltunen
(74) *Attorney, Agent, or Firm*—Lawrence J. Bassuk; W. James Brady; Frederick J. Telecky, Jr.

(57) ABSTRACT

A system for providing a desired substantially constant resistance includes a first transistor interconnected between a first node and a second node. The system also includes a second transistor, the second transistor being diode connected, the first transistor and the second transistor forming a current mirror. A voltage divider is coupled to provide a portion of a voltage associated with the first transistor to the second transistor, the voltage divider being configured parallel to the first transistor to provide a substantially constant resistance between the first node and the second node. A current source is coupled to the second transistor, the current source being controlled to draw an amount of current through the second transistor to set the substantially constant resistance substantially equal to the desired substantially constant resistance.

19 Claims, 4 Drawing Sheets

SYSTEMS FOR PROVIDING A CONSTANT RESISTANCE

TECHNICAL FIELD

This invention relates to electronic circuits, and more specifically to an integrated circuit that can provide a substantially constant resistance.

BACKGROUND

The market for communications and computational devices is constantly improving. As a result, there is an increasing demand for smaller circuit packages that achieve higher performance. For example, communications and video devices, such as amplifier devices, are often designed to operate at increasingly higher bandwidths. To achieve operation at higher bandwidths, such communications devices often require circuitry that includes electronic components having precise values.

As an example, a typical design for an analog circuit often requires a number of passive components, such as resistors and capacitors. Resistors and capacitors can be formed from semiconductor material, such as in an ultra-deep sub-micron (UDSM) process, such that the resistors and capacitors can be included in an integrated circuit (IC). However, on-chip resistors, such as N-well resistors formed in a UDSM process, can have very large variations in resistance value (e.g., −30% to +48%) based on process and temperature variations. Such variations in resistance value may cause increased gain error over high bandwidth in a given communications and/or video application, and can also make such important requirements like the output impedance matching difficult for such devices. In addition, on-chip resistors can provide poor linearity, particularly at high frequencies of operation of the communications and/or video devices. Resistance value variations and linearity can be better controlled through using external circuit devices, such as external precision resistors, and/or by implementing trimming or tuning methods. However, such solutions are often prohibitively expensive and can greatly increase the physical size of the circuit in which they are used.

SUMMARY

One embodiment of the present invention provides a system for providing a desired substantially constant resistance. The system includes a first transistor interconnected between a first node and a second node. The system also includes a second transistor, the second transistor being diode connected, the first transistor and the second transistor forming a current mirror. A voltage divider is coupled to provide a portion of a voltage associated with the first transistor to the second transistor, the voltage divider being configured parallel to the first transistor to provide a substantially constant resistance between the first node and the second node. A current source is coupled to the second transistor, the current source being controlled to draw an amount of current through the second transistor to set the substantially constant resistance substantially equal to the desired substantially constant resistance.

Another embodiment of the present invention relates to a system for providing a substantially constant resistance. The system includes a resistance circuit comprising a first circuit portion configured to provide a resistance between a first node and a second node, and comprising a second circuit portion coupled with the first circuit portion, the second circuit portion receiving a control signal to set a current in the second circuit portion that establishes the resistance in the first circuit portion. A control circuit of the system also includes a replica circuit comprising a third circuit portion and a fourth circuit portion, the third circuit portion being substantially identical to the first circuit portion and the fourth circuit portion being substantially identical to the second circuit portion. The control circuit includes a constant resistor having a resistance that is set for a desired substantially constant resistance. An amplifier is configured to provide the control signal to the second circuit portion to set the resistance of the resistance circuit substantially equal to the constant resistor.

Another embodiment of the present invention includes a system for providing a desired substantially constant resistance. The system comprises means for dividing a voltage associated with a first transistor at an anode of a diode-connected second transistor. The first transistor can be interconnected between a first node and a second node. The system also comprises means for controlling a magnitude of a voltage across the diode-connected second transistor based on a current associated with a current source interconnected between a cathode of the diode-connected second transistor and a negative voltage rail. The system further comprises means for controlling a magnitude of a current flow through the means for dividing the voltage and the first transistor based on the voltage across the diode-connected second transistor. The magnitude of the current flow can be determinative of a substantially constant resistance between the first node and the second node.

DETAILED DESCRIPTION

The present invention relates to electronic circuits, and more specifically to an integrated system for providing a substantially constant resistance.

Figure 1:
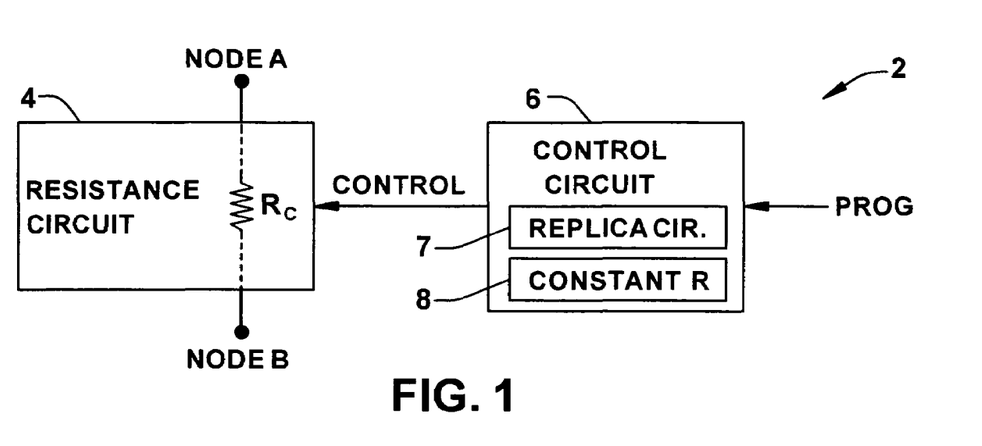
FIG. 1 illustrates an example of a system for providing a substantially constant resistance in accordance with an aspect of the invention.

FIG. 1 illustrates an example of a system 2 for providing a substantially constant resistance in accordance with an aspect of the invention. The system 2 includes a resistance circuit 4 that is configured to provide a substantially constant resistance $R_C$ between two nodes, depicted in the example of FIG. 1 as Node A and Node B. The substantially constant resistance $R_C$ can be set to a value that is a desired substantially constant resistance that is suitable for one or more specific applications. For example, resistance circuit included in an integrated circuit (IC) with one or more additional circuit components (not shown), such that the substantially constant resistance $R_C$ can be substantially linear in response to changes in voltage and/or current, and can adequately compensate for process and temperature variations.

The system 2 also includes a control system 6 that provides a CONTROL signal to the resistor circuit 4. The CONTROL signal can be a voltage signal or a current signal having a magnitude that sets the resistance $R_C$ to a substantially constant resistance. As such, the substantially constant resistance $R_C$ is linear with respect to the CONTROL signal. The control system 6 can be provided a desired constant resistance setting, as demonstrated in the example of FIG. 1. As an example, the desired constant resistance setting can be set at production, manually set, or can be set as a function of a signal provided to the control system 6. For example, the control system 6 may include a replica circuit 7 that is substantially identical to the resistance circuit 4. The control circuit 6 also includes a constant resistor 8 having the desired constant resistance. The desired constant resistance can be fixed or be programmable. As one example, the constant resistor can be implemented as a switched capacitor resistor that can be controlled (e.g., based on a switching frequency and capacitance) to have to the desired constant resistance or it can be an external resistor. The control system 6 thus provides the CONTROL signal to set the substantially constant resistance $R_C$ substantially equal to the desired constant resistance.

Figure 2:
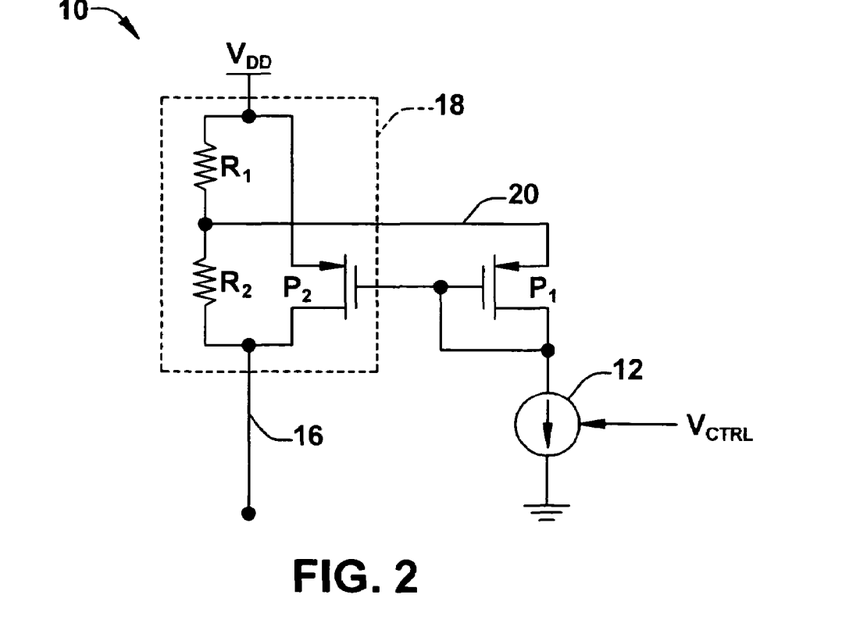
FIG. 2 illustrates an example of a programmable constant resistor in accordance with an aspect of the invention.

FIG. 2 illustrates an example of a resistance circuit 10 in accordance with an aspect of the invention. The resistance circuit 10 includes a current source 12 interconnected between a P-type field effect transistor (FET) $P_1$ and a negative voltage rail, depicted in the example of FIG. 2 as ground. The P-FET $P_1$ is illustrated in the example of FIG. 2 as having a gate coupled to a drain, and is thus diode-connected. As such, the P-FET $P_1$ is demonstrated as coupled to the current source at the cathode of the diode-connected P-FET $P_1$.

The current source 12 is depicted in the example of FIG. 2 as being controlled by a voltage $V_{CTRL}$. The control voltage $V_{CTRL}$ can be provided by a control circuit that can be configurable to set a desired substantially constant resistance, as is demonstrated herein (see e.g., FIG. 3). Thus, the current source 12 provides current flow through the P-FET $P_1$ to ground, with the amount of current flow being based on a magnitude of the voltage $V_{CTRL}$. For example, the current source 12 can be implemented as a transistor operating in a saturation region of operation, such that it draws current through the P-FET $P_1$ based on the magnitude of the voltage $V_{CTRL}$ applied at its gate. Alternatively, the current source 12 can be any of a variety of other types of current sources that can be controlled by the control voltage $V_{CTRL}$.

The P-FET $P_1$ has a gate that is coupled to a gate of a P-FET $P_2$. Thus, the P-FET $P_1$ and the P-FET $P_2$ are configured as a current-mirror, such that an amount of current that flows through the P-FET $P_2$ is based on an amount of current that flows through the P-FET $P_1$. It is to be understood that, although the P-FETs $P_1$ and $P_2$ are demonstrated as FETs in the example embodiments of FIG. 2 and elsewhere herein, they could be implemented instead as bipolar junction transistors (BJTs).

In the example of FIG. 2, the P-FET $P_2$ has a source that is coupled to a voltage $V_{DD}$ and a drain that is coupled to an output node 16. The resistor circuit 10 also includes a pair of resistors $R_1$ and $R_2$ interconnected between the voltage $V_{DD}$ and the output node 16. As such, the P-FET $P_2$ and the resistors $R_1$ and $R_2$ are configured parallel to each other. The resistors $R_1$ and $R_2$ can have a substantially equal resistance value, and can be implemented as N-well resistors, such that the resistance circuit 10 can be included in an integrated circuit (IC). For example, all components of the resistance circuit 10 can be formed in the same ultra-deep sub-micron (UDSM) process, thus providing similar components with substantially identical electrical characteristics, including those resulting from process variations. Therefore, process variations of the individual components in the resistance circuit 10 relative to each other can be substantially cancelled.

As will be demonstrated below, the P-FET $P_2$ and the resistors $R_1$ and $R_2$ are configured as a voltage-controlled resistor 18 that provides a substantially constant resistance between the voltage $V_{DD}$ and the output node 16 for a given amount of current flowing through the P-FET $P_2$. It is to be understood that, although depicted in the example of FIG. 2 as being voltage controlled, the voltage-controlled resistor 18 can be configured to be current controlled, instead.

As demonstrated in the example of FIG. 2, the resistors $R_1$ and $R_2$ are configured as a voltage divider to divide the voltage between $V_{DD}$ and the node 16 at an intermediate node 20 that is coupled to an anode of the diode-connected P-FET $P_1$. As described above, the resistors $R_1$ and $R_2$ can have substantially equal resistance values, such that the node 20 has a voltage that is approximately one-half the drain-source voltage of the P-FET $P_2$. In addition, as also described above, the P-FET $P_1$ and the P-FET $P_2$ have a substantially equal voltage at respective gates based on the current mirror configuration. As such, the P-FET $P_1$ and the P-FET $P_2$ have a mathematical relationship between respective gate-source and drain-source voltage potentials. Therefore, the magnitude of the current associated with the current source 12, as determined by the voltage $V_{CTRL}$, can set a voltage of the gate of the P-FET $P_2$ to operate in a triode region, such that the magnitude of the current associated with the current source 12 controls a current flow through the P-FET $P_2$. Accordingly, for a given voltage $V_{CTRL}$, the voltage-controlled resistor 18 provides a substantially constant resistance for a given current flow from the voltage $V_{DD}$ to the output node 16, such that the voltage-controlled resistor 18 performs substantially linearly and process variations of the individual components are cancelled relative to each other.

To further demonstrate the linearity of the voltage-controlled resistor 18, reference is made to the following equations. The equation for current flow through the P-FET $P_2$ operating in a triode region of operation can be expressed as:

$$I_2 = K*(W/L)*((V_{GS2}-V_{T2})*V_{DS2}-(V_{DS2}^2/2)) \qquad \text{Equation 1}$$

Where:

$I_2$=Current flow through the P-FET $P_2$

K=Constant related to channel mobility and oxide capacitance

W =Channel width

L=Channel length $V_{GS2}$=Gate-source voltage of the P-FET $P_2$ $V_{T2}$=Threshold voltage of the P-FET $P_2$ $V_{DS2}$=Drain-source voltage of the P-FET $P_2$ As demonstrated in Equation 1, the current flow $I_2$ through the P-FET $P_2$, and thus the resistance associated with the P-FET $P_2$ is dependent on the drain-source voltage $V_{DS2}$. However, the drain-source voltage $V_{DS2}$ is expressed as an exponential term in Equation 1, thus rendering the current flow $I_2$ as non-linear with respect to the drain-source voltage $V_{DS2}$.

As described above, because the P-FET $P_1$ and the P-FET $P_2$ are configured as a current mirror, the P-FET $P_1$ and the P-FET $P_2$ have a mathematical relationship between respective gate-source and drain-source voltage potentials. Specifically, because the node 20 between the resistors $R_1$ and $R_2$ has a voltage that is approximately one-half the drain-source voltage of the P-FET $P_2$ at the node 20 (i.e., the source of the P-FET $P_1$), the gate-source voltage of the P-FET $P_2$ can be expressed as follows:

$$V_{GS2}=V_{GS1}+(V_{DS2}/2) \qquad \text{Equation 2}$$

Where:

$V_{GS1}$=Gate-source voltage of the P-FET $P_1$

Substituting the gate-source voltage $V_{GS2}$ of the P-FET $P_2$ from Equation 2 into Equation 1, the current flow through the P-FET $P_2$ can be expressed as:

$$I_2=K*(W/L)*(((V_{GS1}+(V_{DS2}/2))-V_{T2})*V_{DS2}-\\(V_{DS2}^2/2))=K*(W/L)*((V_{GS1}-V_{T2})*V_{DS2}+\\(V_{DS2}^2/2)-(V_{DS2}^2/2))=I_2=K*(W/L)*\\((V_{GS1}-V_{T2})*V_{DS2})$$

Equation 3

As is demonstrated in Equation 3, by configuring the P-FET $P_1$ and the P-FET $P_2$ as a current mirror, and by setting the node 20 to a voltage potential that is approximately one-half the drain-source voltage of the P-FET $P_2$, the dependence on the exponential term of the drain-source voltage $V_{DS2}$ of the current flow $I_2$ through the P-FET $P_2$ can be eliminated. Thus, the current flow $I_2$ through the P-FET $P_2$ is substantially linear with respect to the drain-source voltage $V_{DS2}$. Accordingly, the voltage-controlled resistor 18 has a substantially constant resistance value between the voltage $V_{DD}$ and the output node 16 for a given applied gate-source voltage $V_{GS2}$ of the P-FET $P_2$ in response to a set current associated with the current source 12 based on the control voltage $V_{CTRL}$. It is to be understood that the voltage-controlled resistor 18 need not be interconnected between a positive voltage rail and an output node, but can be configured to provide a substantially constant resistance between any two nodes.

By implementing the resistance circuit 10 in the example of FIG. 2, any of a variety of applications can benefit from having a constant resistor, such as a video driver or a digital device driver, such as demonstrated below. The constant resistance provided by the resistor 18 in the resistance circuit 10 can be such that a high resistor accuracy (e.g., ±5%) can be achieved in an integrated circuit, such as can be based on a tightly controlled gate-oxide parameter of UDSM. Trimming and/or tuning of resistance values can be substantially avoided, but accuracy can be improved even more (e.g., to about ±1%) with additional trimming and/or tuning of the resistance value. In addition, the resistance circuit 10 is very compact as it is both simple and can be implemented within an IC. As such, the resistance circuit 10 can be implemented without the use of bulky and expensive external resistors.

Figure 3:
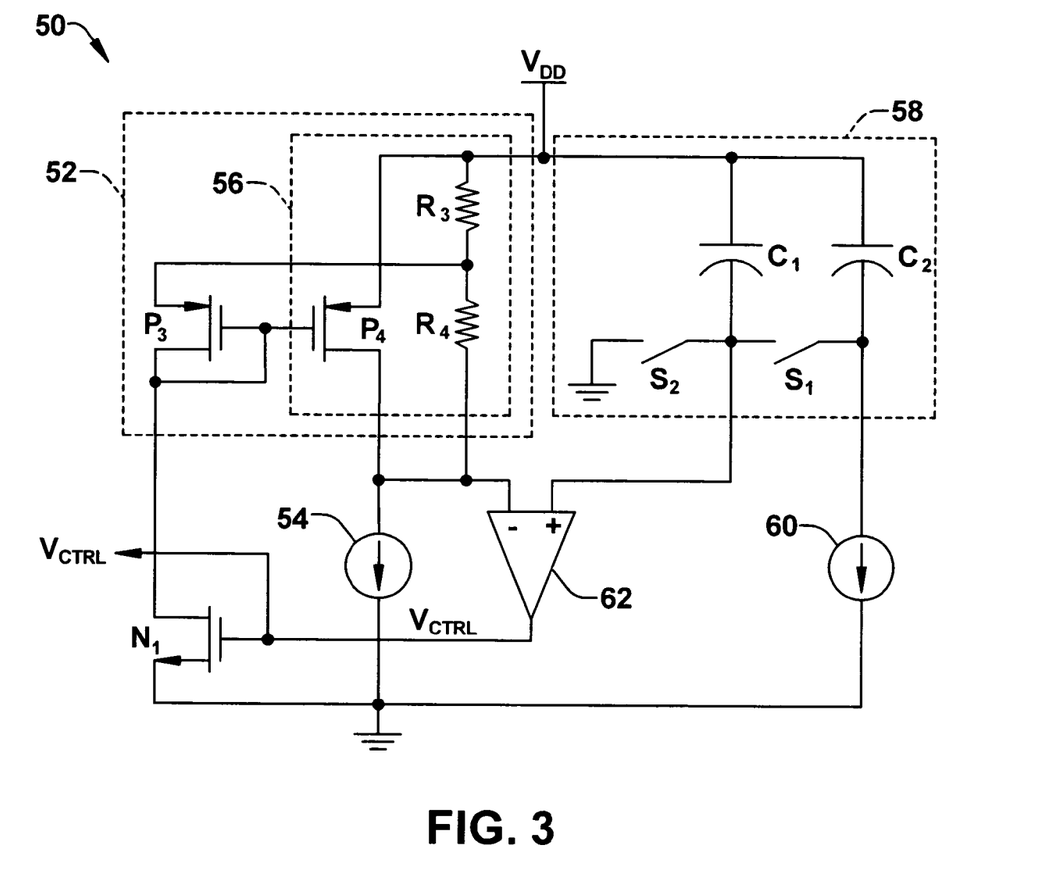
FIG. 3 illustrates an example of a control circuit in accordance with an aspect of the invention.

FIG. 3 illustrates an example of a control circuit 50 in accordance with an aspect of the invention. In the discussion of FIG. 3, reference will be made to the example of FIG. 2. The control circuit 50 is configured to provide the control voltage $V_{CTRL}$ that can set the current of the current source 12 in the example of FIG. 2. For example, as is demonstrated in greater detail below, the control circuit 50 may be configurable to set a desired substantially constant resistance, such that the control voltage $V_{CTRL}$ is provided to the resistor circuit 10 in the example of FIG. 2 to set the constant resistance of the voltage-controlled resistor 18 substantially equal to the desired substantially constant resistance. The control circuit 50 could be included in an IC, and could be included in the same IC (e.g., a single monolithic structure) as the resistor circuit 10 in the example of FIG. 2.

The control circuit 50 includes a replica circuit 52 and a current supply 54. The replica circuit 52 is demonstrated in the example of FIG. 3 as including a P-FET $P_3$, a P-FET $P_4$, and resistors $R_3$ and $R_4$ that are configured as a voltage divider. The P-FET $P_3$ and the P-FET $P_4$ have gates that are coupled together, and thus form a current mirror. The P-FET $P_4$ and the resistors $R_3$ and $R_4$ are configured as a voltage-controlled resistor 56 relative to the current supply 54. The replica circuit 52 is thus demonstrated substantially identically to the resistor circuit 10 in the example of FIG. 2. In addition, as described above, the replica circuit 52 can be included in an IC with the resistor circuit 10 in the example of FIG. 2, such that each of the components in the replica circuit 52 can have the same characteristic values as each of the respective components in the resistor circuit 10. Therefore, the components in the replica circuit 52 and the components in the resistor circuit 10 can have substantially identical electrical characteristics.

The control circuit 50 also includes a constant resistance, which is represented by a switched capacitor resistor 58 and a current supply 60. The switched capacitor resistor 58 includes a capacitor $C_1$, a capacitor $C_2$, and a switch $S_1$ and switch S2. The switched capacitor resistor 58 is substantially configured as a constant resistor having a resistance value that is controlled by the capacitance values of the capacitors $C_2$ and/or a frequency of switching associated with the switch $S_1$ relative to the current supply 60. The switch S2 is controlled to discharge the capacitor $C_2$, such as to supply or ground. The capacitor $C_1$ can be provided to reduce the amount of switching ripple. As such, the switched capacitor resistor 58 can have a resistance value that is set for a desired substantially constant resistance. The current supply 60 can be configured to be substantially identical to the current supply 54, such that the current supply 60 and the current supply 54 each generate a current that is substantially the same.

The control circuit 50 also includes an amplifier 62. The amplifier 62 compares a voltage from the voltage-controlled resistor 56 with a voltage from the switched capacitor resistor 58. The comparator 62 provides an output that is the control voltage $V_{CTRL}$, such as can be output from the control circuit 50 to the resistor circuit 10 in the example of FIG. 2. In addition, the control voltage $V_{CTRL}$ is provided to a gate of an N-FET $N_1$ interconnected between the replica circuit 52 and ground. The N-FET $N_1$ can be configured to operate in the saturation region based on the control voltage $V_{CTRL}$.

The N-FET $N_1$ can operate as a current source for the replica circuit 52 based on the control voltage $V_{CTRL}$, similar to the current source 12 in the example of FIG. 2. The control voltage $V_{CTRL}$ provides feedback to the amplifier 62 via the replica circuit 52, such that the control voltage $V_{CTRL}$ sets the resistance value of the voltage-controlled resistor 56 substantially equal to the desired substantially constant resistance of the switched capacitor resistor 58. Because the replica circuit 52 can be integrated with and configured substantially identically to the resistor circuit 10 in the example of FIG. 2, the resistance value of the voltage-controlled resistor 18 will likewise be set substantially equal to the desired substantially constant resistance of the switched capacitor resistor 58 based on the current flow through the transistor $N_1$ being substantially equal to the current source 12. Accordingly, the control voltage $V_{CTRL}$ has a value set by the comparator so that the resistance of the voltage-controlled resistor 56 substantially equal to the desired substantially constant resistance of the switched capacitor resistor 58. The control voltage $V_{CTRL}$ thus also sets the value of the voltage-controlled resistor 18 substantially equal to the desired substantially constant resistance.

It is to be understood that the control circuit 50 is not intended to be limited to the example of FIG. 3. For example, the current sources 54 and 60 could be omitted, such that the voltage-controlled resistor 56 and the switched capacitor resistor 58 could be interconnected between the amplifier 62 and a voltage source, such as the voltage $V_{DD}$ in the example of FIG. 2. As another example, the switched capacitor resistor 58 is not limited to a switched capacitor resistor, but could be implemented as a different kind of resistor that is configured to provide a substantially constant resistance. Therefore, the control circuit 50 could be implemented in any of a variety of different manners to provide the control voltage $V_{CTRL}$.

Figure 4:
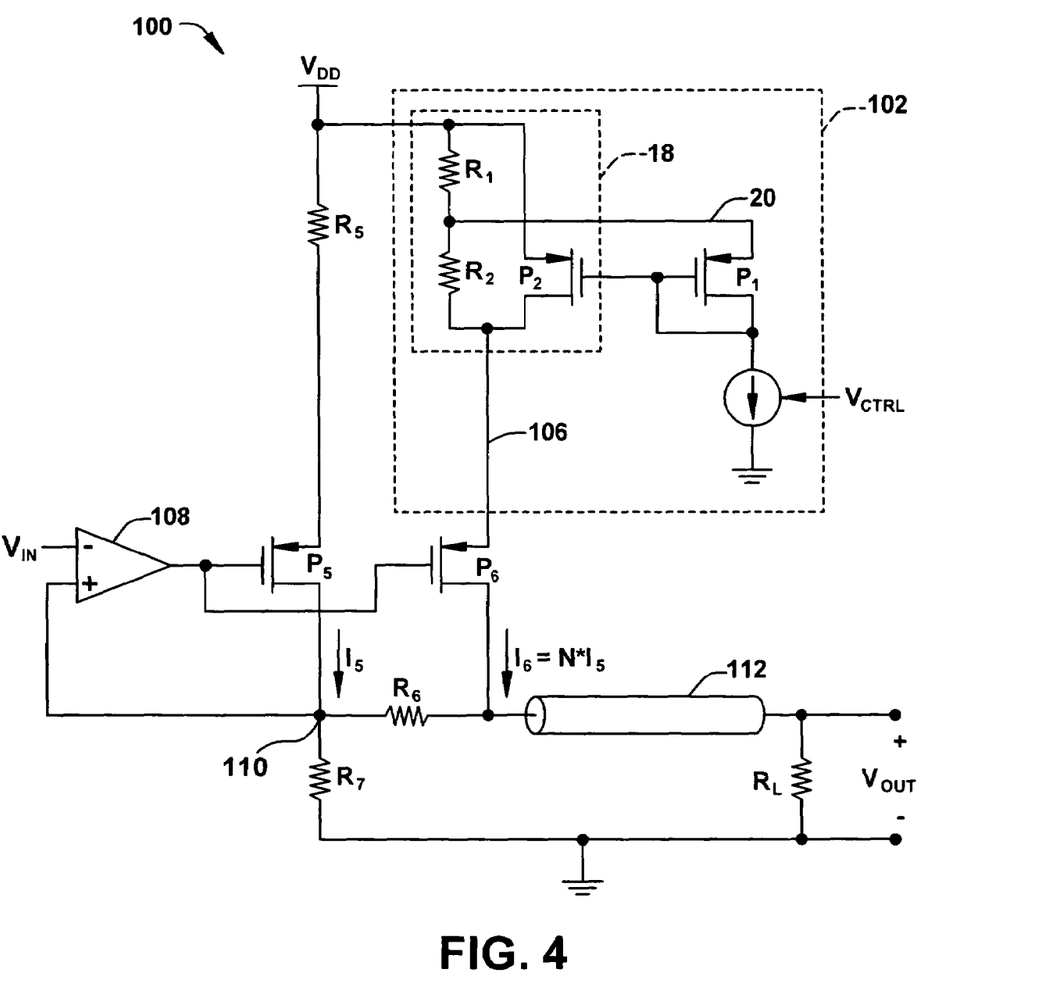
FIG. 4 illustrates an example of a video driver circuit in accordance with an aspect of the invention.

FIG. 4 illustrates an example of a video driver circuit 100 that includes a resistor circuit 102 implemented in accordance with an aspect of the invention. The resistor circuit 102 is configured substantially the same as the resistor circuit 10 described above in the example of FIG. 2. As such, by way of simplification of explanation, the components in the resistor circuit 102 of the video driver 100 are demonstrated in the example of FIG. 4 as having like identifiers as the resistor circuit 10 in the example of FIG. 2. Therefore, the resistor circuit 102 in the example of FIG. 4 includes a voltage-controlled resistor 18 that is configured to provide a substantially constant resistance between a voltage $V_{DD}$ and a node 106 based on a control voltage $V_{CTRL}$. The control voltage $V_{CTRL}$ can be provided from a control circuit, such as the control circuit 50 in the example of FIG. 3. The video driver circuit 100 can be integrated in an IC, and can be included in the same IC as the control circuit 50 in the example of FIG. 3.

The video driver circuit 100 also includes a resistor $R_5$ that is interconnected between the voltage $V_{DD}$ and a P-FET $P_5$. The resistor $R_5$ can be an N-well resistor, such as resulting from a UDSM process. The resistor circuit 102 is coupled to a P-FET $P_6$. The P-FETs $P_5$ and $P_6$ can be electrically matched, such as based on being formed on the same semiconductor wafer, and can have a relative gate-size ratio that is defined by N, where N is a number greater than or equal to one. In the example of FIG. 4, the P-FET $P_6$ has a (W/L) coefficient that is N times the (W/L) coefficient of the P-FET $P_5$. Therefore, in the example of FIG. 4, a current through the P-FET $P_5$ is demonstrated as $I_5$ and a current through the P-FET $P_6$ is demonstrated as 16 being equal to $N*I_5$. The currents $I_5$ and $I_6$ are separated by a resistor $R_6$, which could be an N-well resistor.

The P-FETs $P_5$ and $P_6$ each have a gate that is coupled to the output of an amplifier 108. The amplifier 108 can thus be configured to provide a voltage to the gates of the P-FETs $P_5$ and $P_6$ that is sufficient to operate the P-FETs $P_5$ and $P_6$ in a saturation region of operation. The amplifier 108 receives an input voltage signal $V_{IN}$ and a feedback signal from a node 110. As the voltage of the feedback signal from the node 110 is associated with the current $I_5$, the amplifier 108 can set the current $I_5$, and thus the current $I_6$, based on the input voltage $V_{IN}$. Specifically, the node 110 is separated from ground by a resistor $R_7$, which could be an N-well resistor. This provides a relationship between $V_{IN}$ and the current $I_5$ as follows:

$$I_5 = V_{IN}/R_7 \qquad \text{Equation 4}$$

As is demonstrated below, the video driver circuit 100 can be configured to provide an output voltage $V_{OUT}$ across a load resistor $R_L$ via a cable 112 that is substantially equal to the input voltage $V_{IN}$. The video driver circuit 100 can also be configured to have a substantially constant output impedance $Z_{OUT}$ that is based on the resistor $R_6$ and the gate-size ratio N of the P-FETs $P_5$ and $P_6$. Specifically, the output impedance $Z_{OUT}$ of the video driver circuit 100 can be expressed as:

$$Z_{OUT} = R_6/(N+1) \qquad \text{Equation 5}$$

In addition, the resistors $R_6$ and $R_7$ can have resistance values that are set based on the load resistor $R_L$ and the gate-size ratio N, demonstrated by:

$$R_6 = (N+1)*R_L \qquad \text{Equation 6}$$

$$R_7 = N*R_L \qquad \text{Equation 7}$$

The output impedance $Z_{OUT}$ can thus be expressed as:

$$Z_{OUT} = R_L \qquad \text{Equation 8}$$

The output voltage $V_{OUT}$ can thus be expressed as:

$$V_{OUT} = I_5 * N * R_L \qquad \text{Equation 9}$$

$$V_{OUT} = (V_{IN}/R_7)*N*R_L = (V_{IN}/N*R_L)*N*R_L = V_{OUT} = V_{IN} \qquad \text{Equation 10}$$

It is to be understood that Equations 5-9 are ideal equations. However, as described above, temperature and process variations can greatly affect the resistance values of N-well resistors $R_5$, $R_6$, and $R_7$. For example, the varying resistance value of the resistor $R_7$ can result in an unpredictable value for the current $I_5$. This could result in large variations in the output voltage $V_{OUT}$ relative to the input voltage $V_{IN}$. In addition, the varying resistance value of the resistor $R_6$ can result in an unpredictable value of the output impedance $Z_{OUT}$. The use of more precise external resistors in place of the integrated N-well resistors $R_5$, $R_6$, and $R_7$ is impractical due to size and cost constraints.

To provide a substantially constant value of the output impedance $Z_{OUT}$ and an output voltage $V_{OUT}$ that is substantially equal to a given input voltage $V_{IN}$, the voltage-controlled resistor 18 can provide a substantially constant resistance, such that the currents $I_5$ and $I_6$ can have substantially constant values. For example, the voltage-controlled resistor 18 can have a resistance value $R_8$ that is set based on the control voltage $V_{CTRL}$, such as by the control circuit 50 in the example of FIG. 3. The resistance value $R_8$ can be set such that a ratio of $R_5$ to $R_8$ can be substantially equal to N:

$$N \approx R_5/R_8 \qquad \text{Equation 11}$$

The N-well resistors $R_5$, $R_6$, and $R_7$ can all be integrated and thus formed from the same UDSM process. As such, process and temperature variations can affect the resistance values of the resistors $R_5$, $R_6$, and $R_7$ equally. Therefore, substituting Equations 4 and 11 into Equation 9 results in:

$$V_{OUT} = (V_{IN}/R_7)*(R_5/R_8)*R_L = V_{OUT} = (V_{IN}/R_8)*(R_5/R_7)*R_L \qquad \text{Equation 12}$$

In addition, for a large value of N, substituting Equation 11 into Equation 5 results in:

$$Z_{OUT} \approx (R_6/R_5)*R_8 \qquad \text{Equation 13}$$

Because the N-well resistors $R_5$, $R_6$, and $R_7$ are affected substantially equally by process and temperature variations, the $(R_5/R_7)$ term in Equation 12 and the $(R_6/R_5)$ term in Equation 13 are constants. Therefore, the output voltage $V_{OUT}$ and the output impedance $Z_{OUT}$ are unaffected by the unpredictable resistance values of the N-well resistors $R_5$, $R_6$, and $R_7$, such as based on process and temperature variations. Accordingly, setting the substantially constant resistance $R_8$ of the voltage-controlled resistor 18 via the control voltage $V_{CTRL}$ can result in a substantially constant value of the output impedance $Z_{OUT}$ and an output voltage $V_{OUT}$ that is substantially equal to an applied input voltage $V_{IN}$.

It is to be understood that the video driver circuit 100 in the example of FIG. 4 is but one example of a video driver circuit. Accordingly, any of a variety of variations to the video driver programmable constant resistor 100 can be realized. Furthermore, the voltage-controlled resistor 18 in the resistor circuit 102 is not limited to use in the video driver programmable constant resistor 100, but can be implemented in any of a variety of integrated applications that may benefit from a constant resistance, such as to provide a desired constant output impedance or other purposes for which a substantially precise constant resistance may be needed.

Figure 5:
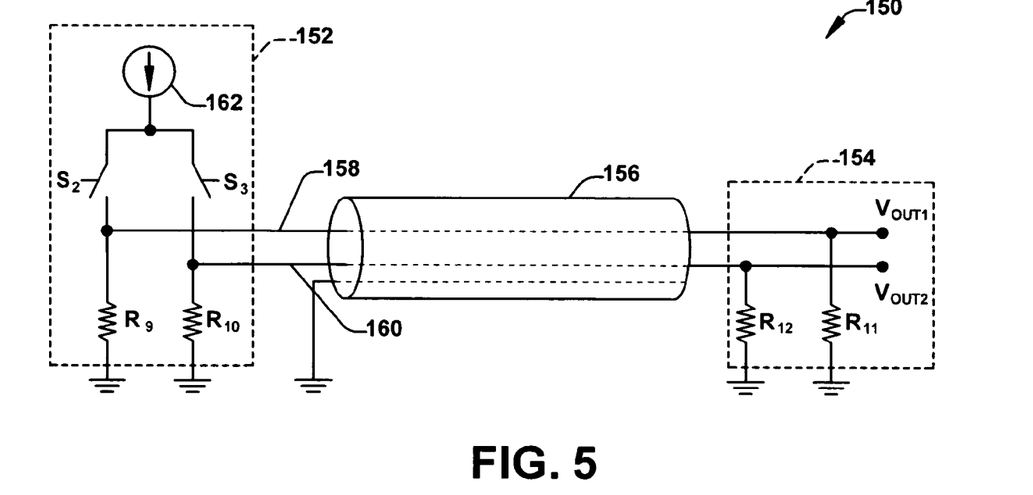
FIG. 5 illustrates an example of a digital device driver in accordance with an aspect of the invention.

FIG. 5 illustrates an example of a digital device driver 150 in accordance with an aspect of the invention. The digital device driver 150 is demonstrated in the example of FIG. 5 with a transmit end 152 and a receive end 154. The transmit end 152 and the receive end 154 are separated by a cable 156, which includes a first conductor 158 and a second conductor 160. The transmit end 152 includes a current source 162. A switch $S_2$ couples the current source 162 to a resistor $R_9$ and the first conductor 158, and a switch $S_3$ couples the current source 158 to a resistor $R_{10}$ and the second current source 160.

The receive end 154 includes a resistor $R_{11}$ and a resistor $R_{12}$ coupled to the conductor 158 and the conductor 160, respectively. Upon closure of the switch $S_2$, a voltage signal associated with the current source 162 and the resistors $R_9$ and $R_{11}$ is transmitted on the conductor 158 to the receive end 154. The voltage is demonstrated at the receive end as an output signal $V_{OUT1}$. Likewise, upon closure of the switch $S_3$, a voltage signal associated with the current source 162 and the resistors $R_{10}$ and $R_{12}$ is transmitted on the conductor 160 to the receive end 154. The voltage is demonstrated at the receive end as an output signal $V_{OUT2}$. As such, the switches $S_2$ and $S_3$ can be opened and closed at high frequency, thus transmitting high-frequency digital signals from the transmit end 152 across the cable 156 to the receive end 154.

The resistors $R_9$ and $R_{10}$ could be N-well resistors, such that one or more of the components in the transmit end 152 are implemented in an IC. As such, the resistance value of the resistors $R_9$ and $R_{10}$ can vary based on process and/or temperature variations. The process and/or temperature variations could result in impedance mismatch between the transmit end 152 and the receive end 154, resulting in signal reflection and/or other deleterious effects. Accordingly, one or both of the resistors $R_9$ and $R_{10}$ can be implemented as voltage-controlled resistors, such as via the resistor circuit 10 in the example of FIG. 2. Thus, impedance can be appropriately matched between the transmit end 152 and the receive end 154.

It is to be understood that the digital device driver 150 in the example of FIG. 5 is one example of a digital device driver. Any of a variety of digital device driver types can be implemented using a voltage-controlled resistor, such as universal serial bus (USB), data highway, and/or RJ-45. The example of FIG. 5 merely demonstrates one more example of a use for a substantially constant resistance, such as could be provided by the resistor circuit 10 in the example of FIG. 2.

Figure 6:
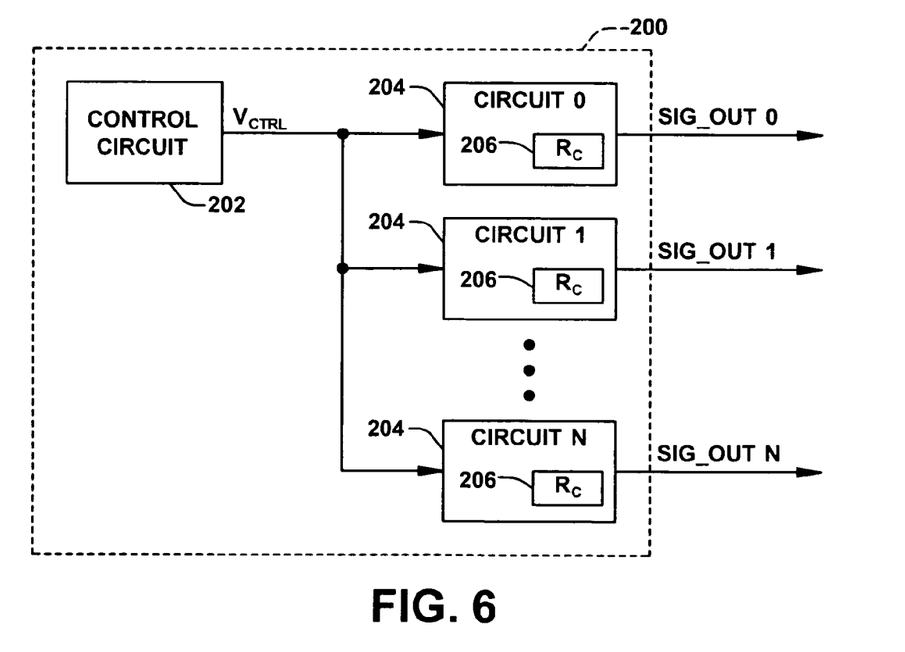
FIG. 6 illustrates an example of an integrated circuit for providing signals in accordance with an aspect of the invention.

FIG. 6 illustrates an example of an IC 200 for providing substantially constant resistance signals in accordance with an aspect of the invention. The integrated circuit 200 includes a control circuit 202. The control circuit 202 can be configured substantially similarly to the control circuit 50 in the example of FIG. 3. The control circuit 202 can be configured to provide a control voltage $V_{CTRL}$. The control voltage $V_{CTRL}$ is provided to a plurality of circuits 204, numbered 0 through N, where N is an integer greater than zero. Each of the circuits 204 includes one or more resistance circuits 206, such as described herein (see, e.g., FIGS. 1 and 2). A resistance $R_C$ of each of the resistance circuits 206 can be set by the control voltage $V_{CTRL}$ to a substantially fixed resistance. It will be understood that by selectively configuring the integrated resistors or other associated circuit parameters in each of the resistance circuits 206, the same or different values of resistance $R_C$ can be provided in each of the resistance circuits. Thus, each of the circuits 204 can be circuits configured to provide at least one signal SIG_OUT that can be substantially unaffected by process and/or temperature variations based on a substantially constant resistance $R_C$.

Additionally, the circuits 204 may not provide the same function relative to each other. As such, the signals SIG_OUT may have different values relative to each other. Thus, the IC 200 may provide a number of different output signals SIG_OUT, each being provided to different applications and/or other circuits. For example, any number of voltage-controlled resistors can provide substantially fixed resistance between respective nodes based on the control voltage $V_{CTRL}$ generated from a single control circuit 202. Accordingly, the example of FIG. 6 demonstrates space savings realized by implementing a number of integrated substantially constant resistors.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A system for providing a desired substantially constant resistance comprising:
   A. a first transistor interconnected between a first node and a second node;
   B. a second transistor, the second transistor being diode connected, the first transistor and the second transistor forming a current mirror;
   C. a voltage divider coupled to provide a portion of a voltage associated with the first transistor to the second transistor, the voltage divider being configured parallel to the first transistor to provide a substantially constant resistance between the first node and the second node;
   D. a current source coupled to the second transistor, the current source being controlled to draw an amount of current through the second transistor that sets the substantially constant resistance substantially equal to the desired substantially constant resistance; and
   E. the voltage divider comprising two matched N-well resistors having substantially equal resistance values, such that the second transistor is coupled to an intermediate node of the voltage divider having a voltage that is one-half of a drain-source voltage associated with the first transistor.

2. The system of claim 1, wherein the system is provided in an integrated circuit (IC), the system further comprising a control circuit configured to provide a control signal that controls the current source to set the amount of current drawn through the second transistor.

3. The system of claim 2, wherein the system for providing the desired substantially constant resistance is one of a plurality of systems for providing at least one desired substantially constant resistance, and wherein the control circuit provides the control voltage to each of the systems for providing the at least one desired substantially constant resistance.

4. The system of claim 2, wherein the voltage divider is a first voltage divider, and wherein the control circuit comprises a replica circuit, the replica circuit comprising a third transistor, a fourth transistor, and a second voltage divider configured substantially identically to the first transistor, the second transistor, and the first voltage divider.

5. The system of claim 4, wherein the current source is a first current source, and wherein the control circuit comprises a switched capacitor resistor configured to have a resistance that is substantially equal to the desired substantially constant resistance, the control circuit further comprising a second current source interconnected between the switched capacitor resistor and the negative voltage rail, the second current source having a substantially equal value as a third current source associated with the replica circuit.

6. The system of claim 5, wherein the control circuit further comprises an amplifier that provides the control signal based on comparing a voltage associated with the replica circuit and a voltage associated with the switched capacitor resistor.

7. The system of claim 6, wherein the control circuit further comprises a current source coupled to the replica circuit, the control transistor being controlled by the control signal to set the substantially constant resistance of the replica circuit substantially equal to the desired substantially constant resistance of the switched capacitor resistor.

8. An integrated circuit (IC) comprising the system for providing the desired substantially constant resistance of claim 1.

9. The IC of claim 8, further comprising a video driver circuit, the video driver circuit comprising:
 a first current path from the first node through an integrated resistor and a third transistor, the first current path having a first current that is controlled by an input voltage; and
 a second current path from the first node through the second node and a fourth transistor to an output of the video driver circuit, the second current path having a second current that is proportional to the first current.

10. The IC of claim 9, wherein the fourth transistor has a channel width-to-length ratio that is approximately equal to a channel width-to-length ratio associated with the third transistor times a multiplier, and wherein a ratio of the substantially constant resistance and a resistance associated with the integrated resistor is approximately equal to the multiplier, such that an output voltage and an output impedance of the integrated video driver circuit can be provided substantially independent of process and temperature variations.

11. A system for providing a substantially constant resistance, the system comprising:
 A. a resistance circuit comprising a first circuit portion configured to provide a resistance between a first node and a second node, and comprising a second circuit portion coupled with the first circuit portion, the second circuit portion receiving a control signal to set a current in the second circuit portion that establishes the resistance in the first circuit portion;
 B. a control circuit comprising:
  i. a replica circuit comprising a third circuit portion and a fourth circuit portion, the third circuit portion being substantially identical to the first circuit portion and the fourth circuit portion being substantially identical to the second circuit portion;
  ii. a constant resistor having a resistance that is set for a desired substantially constant resistance; and
  iii. an amplifier configured to provide the control signal to the second circuit portion to set the resistance of the resistance circuit substantially equal to the constant resistors;
 C. the first circuit portion comprising a first transistor and the second circuit portion comprising a second transistor, the first transistor and the second transistor being configured as a current mirror, and
 D. the second transistor is configured as a diode-connected transistor, and the first circuit portion comprises a voltage divider configured parallel to the first transistor, and having an intermediate node coupled to provide a portion of a voltage associated with the first transistor to the second transistor.

12. The system of claim 11, wherein the second circuit portion comprises a current source that provides the current in the second circuit portion, and wherein the control signal is a voltage signal that sets a magnitude of the current of the current source based on a magnitude of the voltage signal, the current in the second circuit portion being mirrored to the first circuit portion.

13. The system of claim 11, wherein the voltage divider comprises two matched N-well resistors having substantially equal resistance values, such that the second transistor is coupled to the intermediate node of the voltage divider having a voltage that is one-half of a drain-source voltage associated with the first transistor.

14. The system of claim 11, wherein the constant resistor of the control circuit further comprises a switched capacitor resistor operated to have a substantially constant resistance value that is substantially equal to the desired substantially constant resistance.

15. The system of claim 11, wherein the control circuit further comprises a control transistor coupled to the replica circuit, the control transistor being controlled by the control signal to set a substantially constant resistance associated with the replica circuit substantially equal to the desired substantially constant resistance of the constant resistor.

16. An integrated circuit (IC) comprising the system for providing the desired substantially constant resistance of claim 11.

17. The IC of claim 16, further comprising a video driver circuit, the video driver circuit comprising:
 a first current path from the first node through an integrated resistor and a third transistor, the first current path having a first current that is controlled by an input voltage; and
 a second current path from the first node through the first circuit portion and a fourth transistor to an output of the video driver circuit, the second current path having a second current that is proportional to the first current by a multiplier N, where N is a number greater than one;
 wherein the fourth transistor has a channel width-to-length ratio that is approximately equal to a channel width-to-length ratio associated with the third transistor times the multiplier N, and wherein a ratio of the resistance of the first circuit portion and a resistance associated with the integrated resistor is approximately equal to the multiplier N.

18. The IC of claim 16, further comprising a plurality of programmable resistance circuits each configured to provide a resistance between a pair of respective nodes based on the control signal.

19. A system for providing a desired substantially constant resistance comprising:
 A. means for dividing a voltage associated with a first transistor at an anode of a diode-connected second transistor, the first transistor being interconnected between a first node and a second node;
 B. means for controlling voltage across the diode-connected second transistor based on a current associated with a current source interconnected between a cathode of the diode-connected second transistor and a negative voltage rail; and
 C. means for controlling current through the means for dividing the voltage and the first transistor based on the voltage across the diode-connected second transistor, the current setting a substantially constant resistance between the first node and the second nodes;
 D. the means for controlling voltage further comprises:
  i. means for replicating the substantially constant resistance;
  ii. means for setting the desired substantially constant resistance;
  iii. means for comparing a voltage associated with the means for replicating the substantially constant resistance and a voltage associated with the means for setting the desired substantially constant resistance; and
  iv. means for adjusting the replicated substantially constant resistance to be substantially equal to the desired substantially constant resistance, which also controls the current for setting the substantially constant resistance between the first node and the second node to the desired substantially constant resistance.

* * * * *